United States Patent [19]

Mason et al.

[11] 4,253,910
[45] Mar. 3, 1981

[54] ORNAMENTAL MIRROR AND APPARATUS AND METHOD FOR MAKING SAME

[75] Inventors: Robert C. Mason, High Springs, Fla.; Joseph Scerbo, Bayshore, N.Y.

[73] Assignee: Colonial Mirror & Glass Corp., Brooklyn, N.Y.

[21] Appl. No.: 963,409

[22] Filed: Nov. 24, 1978

[51] Int. Cl.³ .............................................. B44C 1/22
[52] U.S. Cl. ................... 156/633; 156/640; 156/656; 156/663; 156/345; 427/272; 427/287; 427/161; 427/165; 428/209; 428/210; 156/659.1; 156/76; 156/155; 156/245; 427/259; 427/264; 427/266; 430/14; 430/308; 40/1
[58] Field of Search .............. 156/659, 656, 663, 640; 427/272, 287; 428/210

[56] References Cited

U.S. PATENT DOCUMENTS

| | | | |
|---|---|---|---|
| 1,942,686 | 1/1934 | Colbert et al. | 204/18 R |
| 2,036,021 | 3/1936 | Cheney | 156/657 |
| 2,807,111 | 9/1957 | Turner | 428/210 X |
| 2,887,367 | 5/1959 | Eisner | 156/659 |
| 3,808,067 | 4/1974 | Brown | 156/640 X |
| 4,013,498 | 3/1977 | Frantzen et al. | 156/640 X |
| 4,124,437 | 11/1978 | Bond et al. | 156/640 |

FOREIGN PATENT DOCUMENTS

| | | | |
|---|---|---|---|
| 7310862 | 2/1974 | Netherlands | 427/272 |
| 597363 | 3/1978 | Switzerland | 156/640 |

*Primary Examiner*—George F. Lesmes
*Assistant Examiner*—Alexander S. Thomas
*Attorney, Agent, or Firm*—Watson, Leavenworth, Kelton & Taggart

[57] ABSTRACT

Linear means, particularly for producing a mirror having a discrete transparent portion of a desired shape, configuration or ornamentation and having a backing which may have a discrete image of corresponding shape, configuration or ornamentation affixed in juxtaposition thereto, is set forth. The means of production of said mirror include providing, upon a glass surface, a layer of reflective substance, applying over said reflective substance, a layer of protective resist material which delineates, outlines and profiles said desired shape, configuration or ornamentation, then treating said coated glass surface to set said resist and washing the same to remove unprotected reflective portions delineated by said protective layer and exposed to said wash.

3 Claims, 5 Drawing Figures

ORNAMENTAL MIRROR AND APPARATUS AND METHOD FOR MAKING SAME

BACKGROUND OF THE INVENTION

1. Field of the Invention

The present invention broadly relates to the art of etching, and more particularly to the art of etching to provide mirrors having window areas of discrete predetermined configuration incorporated therein, which may be backed by an ornamental layer having design areas corresponding and juxtaposed to said window areas.

2. Description of the Prior Art

Etching of glass and other materials to provide ornamental articles is well-known in the art. Various means of producing images in glassware and metals have been utilized, the variations thereof depending upon the particular workpiece, the design or ornamentation desired to be incorporated therein and the effect desired to be created. There are, however, certain steps which are common to many of those processes.

Frederecici, U.S. Pat. No. 154,032, Bradley, U.S. Pat. No. 243,200, Stern, U.S. Pat. No. 322,864, Paini, U.S. Pat. No. 343,889, Freidrich, U.S. Pat. No. 1,205,728, Kueffel et al., U.S. Pat. No. 2,374,356, Maleyre, U.S. Pat. No. 2,530,436 and Becca et al., U.S. Pat. No. 3,759,753, all involve, in one form or another, means of delineating an image upon a surface, such as the utilization of stenciling or other means of patterning a design upon an object, applying a protective resist substance and etching. Each also teaches removing the protective resist material following etching.

Other well-known methods include the use of photoresist materials, processed either in the positive or negative mode, to delineate the desired image. Examples are found in Spitzer, U.S. Pat. No. 865,276, Ross, U.S. Pat. No. 2,094,432, Van Natter, U.S. Pat. No. 3,205,155 and Mesley, U.S. Pat. No. 3,642,476. Of the above, only Spitzer does not mention the removal of the photo-resist material.

Colbert et al., U.S. Pat. No. 1,942,686, discloses a process for producing an ornamental mirror wherein the reflective metallic coating of the mirror is first completely covered by a protective copper coating. Removal of the copper and silver by etching is accomplished subsequent to a photo-resist cold top enamel process. Two protective layers, the copper and the reflective layer, especially if a silkscreening method is utilized to achieve the desired design, as exemplified in the Colbert patent.

A further patent illustrating a method of making a transparent area in a mirror is Cheney, U.S. Pat. No. 2,036,021, wherein a protective coating, capable of removal, is placed completely over the reflective backing of the glass. Photosensitive material is utilized to create the desired ornamentation and thereafter the protective coating, exposed by the washing away of the soluble photosensitive material, is removed to expose the reflective metallic area for etching.

Also of interest are references disclosing various methods and devices for distributing the etching solution over the workpiece, such as U.S. Pat. No. 1,081,290 and U.S. Pat. No. 1,313,233. These patents illustrate the use of gas to agitate the etching solution, a procedure quite different from that embraced by the present invention.

One final reference, of only peripheral interest, is Souliner, U.S. Pat. No. 2,684,892 which teaches the use of particular etching compositions.

None of these references, however, either alone or in combination, even suggests the invention herein disclosed.

SUMMARY OF THE INVENTION

The present invention relates to production of ornamental mirrors by an efficient process which requires no manual manipulation of the workpiece at any stage. The present invention provides for the creation of discrete, window or transparent portions in a mirror by a use of apparatus which permits all steps of the process, including baking, cooling and application of a washing agent, to occur in a continuous, linear mode.

In the practice of the present invention, discrete, transparent window areas are created in a mirror without the necessity of removal of a protective resist layer. It is contemplated that the resist layer be of such permanence as to provide a durable protective coating for said reflective layer. A unit of glass of desired configuration is coated on one surface with a reflective substance, the reflective layer thereafter being overlaid with the protective resist coat. The resist layer, applied by means of a silkscreen having porous and non-porous portions, delineates and profiles a desired ornamental image, the reflective layer remaining unprotected by resist in the image area.

Subsequent to the application of the protective layer, the latter is permitted or caused to set and the washing cycle then ensues. In the preferred embodiment, the article is heated in order to set the protective resist layer and is then cooled only slightly. In accordance with the teaching of the present invention, the heat energy remaining in the treated article after cooling is utilized to heat the washing agent to favorable temperatures.

The washing agent removes the reflective layer only in those areas unprotected by resist, thereby creating the discrete transparent portions of the mirror. The apparatus has been designed to minimize the amount of washing solution employed, but to insure that such solution is resident on the surface for a sufficient period of time to permit the complete removal of the exposed reflective layer. Pinch rollers are utilized in conjunction preferably with correspondingly positioned drip nozzles to create a puddling effect of the washing agent over the exposed reflective layer as the article passes through the wash cycle.

These and other features, objects and advantages will become apparent from the following drawings and description thereof.

BRIEF DESCRIPTION OF THE DRAWINGS

In the drawings, like reference numerals have been employed to refer to like parts throughout.

DESCRIPTION OF THE DRAWINGS OF THE PREFERRED EMBODIMENT

Figure 1:
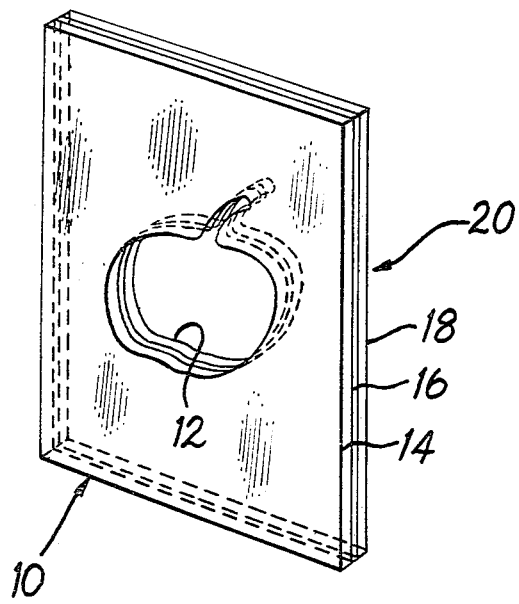
FIG. 1 is a front perspective view of the mirror of the present invention with the thicknesses of layers exaggerated for clarity.
Figure 2:
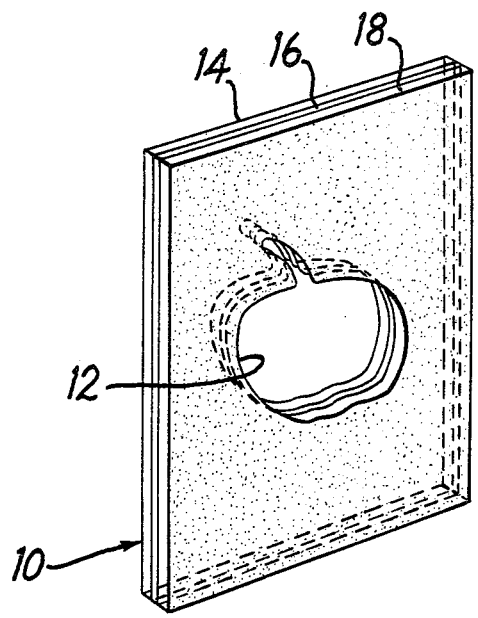
FIG. 2 is a rear perspective view of the mirror of the present invention, also with layer thicknesses exaggerated for clarity.

FIGS. 1 and 2 illustrate the embodiment of the present invention of a mirror 10 having a discrete transparent portion 12 therein. Mirror 10, of any desired shape or configuration, is composed of a unit of glass 14, mirrored by an application of a suitable reflective layer 16 of backing substance, such as silver nitrate which may have a copper sulphate overcoat, applied by methods known in the art. A protective layer 18 of material not susceptible to acid degradation, preferably an epoxy paint, covers and protects mirrored backing layer 16, except in discrete transparent image area 12.

Transparent portion 12 may be of any desired design, shape or configuration. The backing 20, carries the image 21 (illustratively, an apple) which will eventually show through image area 12. Preferably, backing 20 will cover substantially the entire rear face of the mirror and will be affixed thereto in any suitable fashion with image 21 juxtaposed to image area 12.

The design image 21, which will eventually show through transparent window portion 12 of complete mirror 10, is converted to photo silkscreen, by methods known in the art such as by a direct photo emulsion process. The design may originate from a slick, poster, photograph or other image which may be transposed to a silkscreen.

Figure 3:
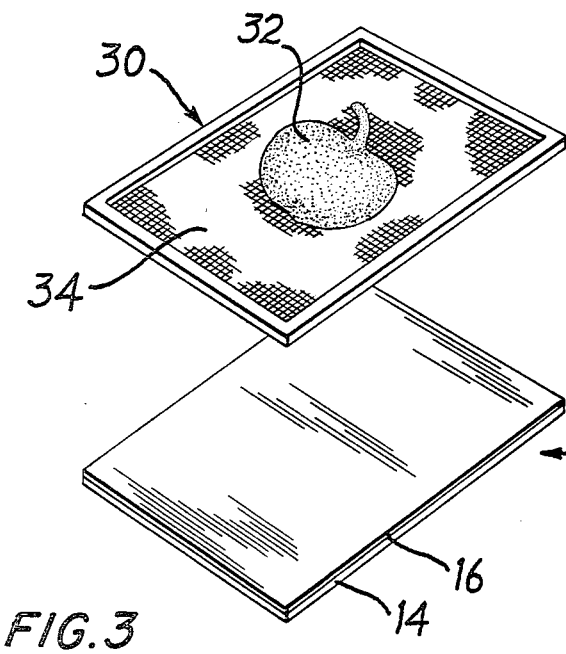
FIG. 3 is an exploded perspective view of the mirror of FIG. 1 underlying the silkscreen prior to an application of the protective layer.
Figure 4:
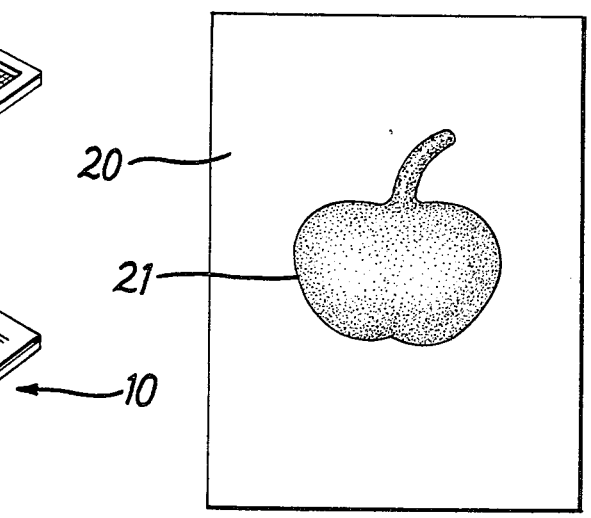
FIG. 4 is a front perspective view of the original photograph which will form the backing on the finished product and which carries the image from which the silkscreen was prepared, which image will show through the transparent window area of the completed mirror.

FIG. 3 illustrates completed photo silkscreen 30, the configured image design 32 being that of an apple. In the photo emulsion silkscreening process, the desired image results as a negative, thus being opaque, non-porous and impenetrable to the resist substances utilized in practicing the present invention. The remaining border portion 34 of completed silkscreen 30, is porous to the resist substance, thereby providing a casting form for layer 18.

The silkscreen 30 can be of the same size and configuration as mirror 10. Since backing 20 with the original image 21 generates the silkscreen image and since the silkscreen image determines the size, configuration and location of the window areas, the appearance of the final product can be controlled by appropriately controlling the creation of the silkscreen design. It should be remembered that in the preferred embodiment, the original image which is used to generate the silkscreen is the same image which is to form the backing on and will show through the window areas of the final product.

A unit of glass 14, is provided with a mirrored face thereof through the use of established methods in the art for applying a reflective substance layer 16. Silkscreen 30, having a non-porous, opaque image 32, is positioned upon the surface of reflective coating layer 16. A protective coating 18, preferably being an epoxy paint, in its liquid state, is deposited on silkscreen 30. Said liquid protective coating passes through porous portion 34 of silkscreen 30, contacting and adhering to reflective layer portion 16 of glass 14 in those areas underlying the porous areas of the screen. Silkscreen 30 is then removed. At this point, image area 12 of reflective layer 16 is exposed, whereas the remaining portions of layer 16 are covered by protective layer 18.

Figure 5:
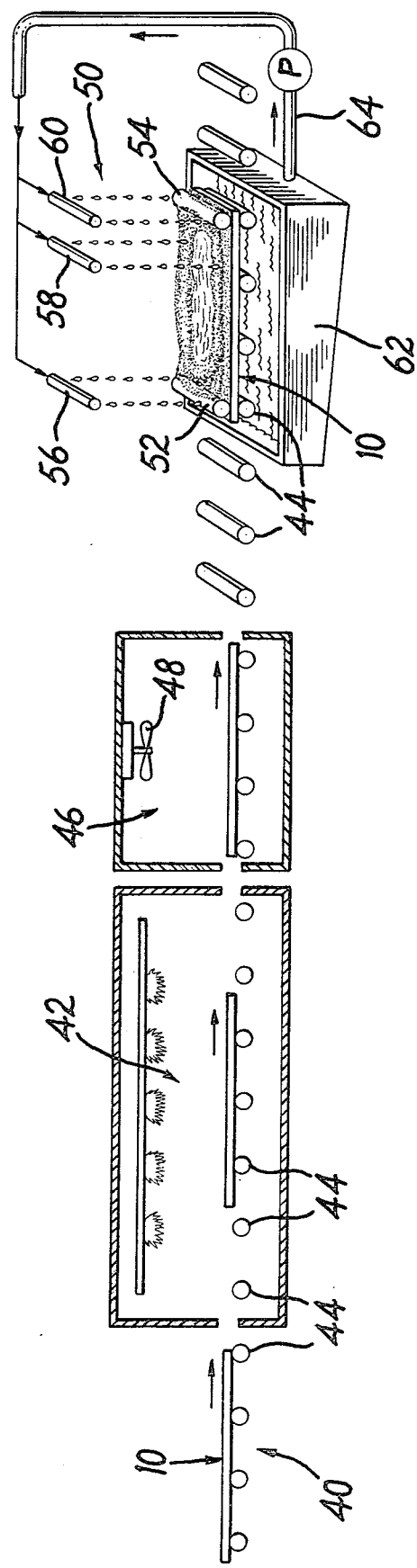
FIG. 5 illustrates the apparatus involved in the heating, cooling and washing cycle.

The finishing process is illustrated in FIG. 5 wherein treated mirror 10 proceeds to baking, cooling and washing cycles which occur in a continuous linear mode, as preferably, do all prior steps on feed line 40. Treated mirror 10 enters heating chamber 42 upon continuous feed line 40 comprised of rollers, collectively numbered 44, or other appropriate conveying means. Protective layer 18 dries and sets while in chamber 42. When epoxy is used, the preferred temperature to which the epoxy should be brought should be approximately 250° F. (121° C.) to properly set the epoxy. The speed of continuous feed line 40 is adjusted according to the heating capacity of chamber 42 and the length of time necessary for the proper setting of the protective substance utilized. The manner of setting the resist layer is selected according to the resist employed.

In the preferred embodiment, upon exiting from chamber 42, treated mirror 10 enters cooling apparatus 46 which is designed to reduce the temperature of treated mirror 10 slightly to about 215° to 220° F. (101.5° to 105.5° C.). Cooling unit 46 may utilize an air circulation means such as fan 48. Means to determine when the desired temperature is reached, such as a thermostat, may also be utilized. It is desired to reduce the temperature of the workpiece in the cooling stage to the above temperature to prevent cracking of the glass and to prevent unnecessary vaporization and evaporation of the washing agent during the wash stage of the cycle. In an effort to improve the economy and efficiency of the process, the temperature of the workpiece should not be reduced to an unnecessary low value. The heat retained in the workpiece serves to preheat and heat the washing agent during the wash cycle, thus, reducing or eliminating the need for additional wash agent heating means.

Treated mirror 10, thereafter, having protective layer 18 dried and set, enters wash stage area apparatus 50 upon support rollers 44 of continuous feed line 40. Located above a support roller within washing apparatus 50, and near the entrance thereof, is cooperating pinch roller 52 which is vertically movable. Also situated near the exit of washing apparatus 50 is a second pinch roller 54. Pinch rollers 52 and 54 float up and down upon the entrance and exit of the glass between them and their cooperating feed rollers 44.

A means for applying the washing agent may be provided by drip shower pipes 56, 58 and 60 positioned above the route of passage of treated mirror 10. It is contemplated that the washing agent application means be positioned to allow the pinch rollers to function as dams, thereby causing the washing agent to puddle, which puddling effect results in the washing agent being resident on the rear face of mirror 10 for a sufficient time to effectively wash the reflective layer away in exposed, non-protected area 36.

Where only two pinch rollers are utilized, it is desired that a first drip pipe 56 be positioned to deposit washing agent upon the treated mirror at a point upstream of first pinch roller 52. A second drip pipe 58 is positioned downstream of roller 52 and upstream of roller 54 to deposit washing agent upon the treated mirror between the pinch rollers. A third drip pipe 60 may also be employed on the downstream side of the second pinch roller to complete the removal of the undesired reflective backing layer.

Depending upon the size or configuration or design of the desired image 12 of the workpiece, further pinch rollers and drip pipes may be utilized in a manner such that the washing agent will be properly directed, dammed and distributed to wash the article in accordance with the above disclosure.

It may be noted that an air spray, solvent or both may be similarly incorporated subsequent to the wash stage to clean any undesired materials from the surface of finished mirror 10.

It is contemplated that the agent utilized as a washing agent may be ferrous chloride which is well-known as an etching agent in the art. A catch basin 62 and recirculating means 64 is incorporated in washing apparatus 50 such that the washing agent may be recycled. The washing agent, when saturated with silver, may be changed and the silver reclaimed.

After the treated and washed mirror has dried, the original design is placed against the back of mirror 10. Since the configuration of image 21 is identical with the configuration of window 12, the two may be precisely juxtaposed. In the final product, the original design or photo shows through the front of the mirror and is framed by the reflective portions thereof.

Although in the preferred embodiment an epoxy is used as the resist, other agents can also be employed. For example, agents that set quickly without application of heat, particularly agents which set exothermally, thereby raising the temperature of the mirror without use of an external heat source, are especially suitable.

It will be apparent to those skilled in the art that various modifications and variations of the invention herein disclosed may be made without departing from the spirit and scope thereof.

What is claimed is:

1. A method of making a mirror with a reflective layer having at least one transparent design portion and having a backing with corresponding discrete design portions juxtaposed thereto comprising:
    transposing a discrete design from a backing article to a silkscreen;
    transposing said design from said silkscreen to a unit of glass, having a reflective backing and being correspondingly sized to said desired backing, by superimposing said silkscreen upon said reflective backing and applying a protective resist substance through said silkscreen to areas of said reflective layer not underlying said discrete design portion of said silkscreen;
    removing, by means of a washing agent, portions of said reflective layer not protected by said resist substance; and
    applying said backing over said protective resist layer, said transparent design portion of said unit of said mirror and said discrete design portions of said backing being juxtaposed, wherein, subsequent to the application of said protective resist layer, said coated glass is heated to set said protective resist substance, is then slightly cooled in a controlled manner prior to application of said washing agent.

2. The method of claim 1 wherein said resist substance is an epoxy and wherein said coated glass is heated to at least about 250° F. and then cooled to about 215° to 220° F.

3. The method of claim 1 wherein said reflective layer washing agent is caused to puddle upon said coated surface by movable, vertically tensioned pinch rollers, and wherein said protective resist substance is resistant to action of said washing agent.

* * * * *